United States Patent
Chen et al.

(10) Patent No.: US 10,749,046 B2
(45) Date of Patent: Aug. 18, 2020

(54) ENCAPSULATION STRUCTURE FOR IMAGE SENSOR CHIP AND METHOD FOR MANUFACTURING THE SAME

(71) Applicant: TRIPLE WIN TECHNOLOGY(SHENZHEN) CO. LTD., Shenzhen (CN)

(72) Inventors: Chia-Wei Chen, New Taipei (TW); Shin-Wen Chen, New Taipei (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 0 days.

(21) Appl. No.: 16/201,959

(22) Filed: Nov. 27, 2018

(65) Prior Publication Data
US 2019/0393362 A1     Dec. 26, 2019

(30) Foreign Application Priority Data
Jun. 26, 2018 (CN) ............................ 2018 1 0669963

(51) Int. Cl.
*H01L 31/0203*   (2014.01)
*H01L 31/0216*   (2014.01)
*H01L 31/0232*   (2014.01)
*H01L 31/02*     (2006.01)
*H01L 31/18*     (2006.01)

(52) U.S. Cl.
CPC .... *H01L 31/0203* (2013.01); *H01L 31/02005* (2013.01); *H01L 31/02164* (2013.01); *H01L 31/02165* (2013.01); *H01L 31/02327* (2013.01); *H01L 31/18* (2013.01)

(58) Field of Classification Search
CPC ....................... H01L 31/0203; H01L 31/02005
USPC ........................................................ 257/432
See application file for complete search history.

(56) References Cited

U.S. PATENT DOCUMENTS

| | | | |
|---|---|---|---|
| 2006/0006511 A1* | 1/2006 | Roh | B81B 7/0067 257/680 |
| 2006/0091487 A1* | 5/2006 | Hanada | H01L 24/48 257/432 |
| 2006/0290802 A1* | 12/2006 | Webster | H04N 5/2253 348/340 |
| 2008/0267616 A1* | 10/2008 | Kinoshita | G02B 7/02 396/518 |
| 2011/0156187 A1* | 6/2011 | Tu | H01L 27/14618 257/432 |

(Continued)

FOREIGN PATENT DOCUMENTS

| TW | 544889 | 8/2003 |
|---|---|---|
| TW | M455258 | 6/2013 |
| TW | I425597 | 2/2014 |

*Primary Examiner* — Igwe U Anya
(74) *Attorney, Agent, or Firm* — ScienBiziP, P.C.

(57) ABSTRACT

An encapsulating structure to protect an image sensor chip at all times during manufacture and use includes a printed circuit board, an image sensor chip, a protecting sheet, and a package portion. The image sensor chip is mounted on the printed circuit board and the protecting sheet is mounted on the image sensor chip. The package portion is entirely opaque and is formed on the printed circuit board, the package portion encloses side wall of the image sensor chip, the protecting sheet, and portion of surface of the protecting sheet away from the image sensor chip. A method for manufacturing same is also disclosed.

4 Claims, 7 Drawing Sheets

(56) References Cited

U.S. PATENT DOCUMENTS

2013/0038783 A1* 2/2013 Shimizu ............... H04N 5/2254
 348/360
2017/0272634 A1* 9/2017 Wang ................... H04N 5/2258

* cited by examiner

ENCAPSULATION STRUCTURE FOR IMAGE SENSOR CHIP AND METHOD FOR MANUFACTURING THE SAME

FIELD

The subject matter herein generally relates to packaging of components.

BACKGROUND

A chip encapsulation structure is for an image sensor chip which can be mounted on a printed circuit board. The chip encapsulation structure may be exposed to the environment before a lens module is received therein, and the image sensor chip can be polluted because of dust and other contaminants in the environment.

Therefore, there is room for improvement within the art.

BRIEF DESCRIPTION OF THE DRAWINGS

Implementations of the present technology will now be described, by way of embodiments only, with reference to the attached figures.

DETAILED DESCRIPTION

Figure 1:
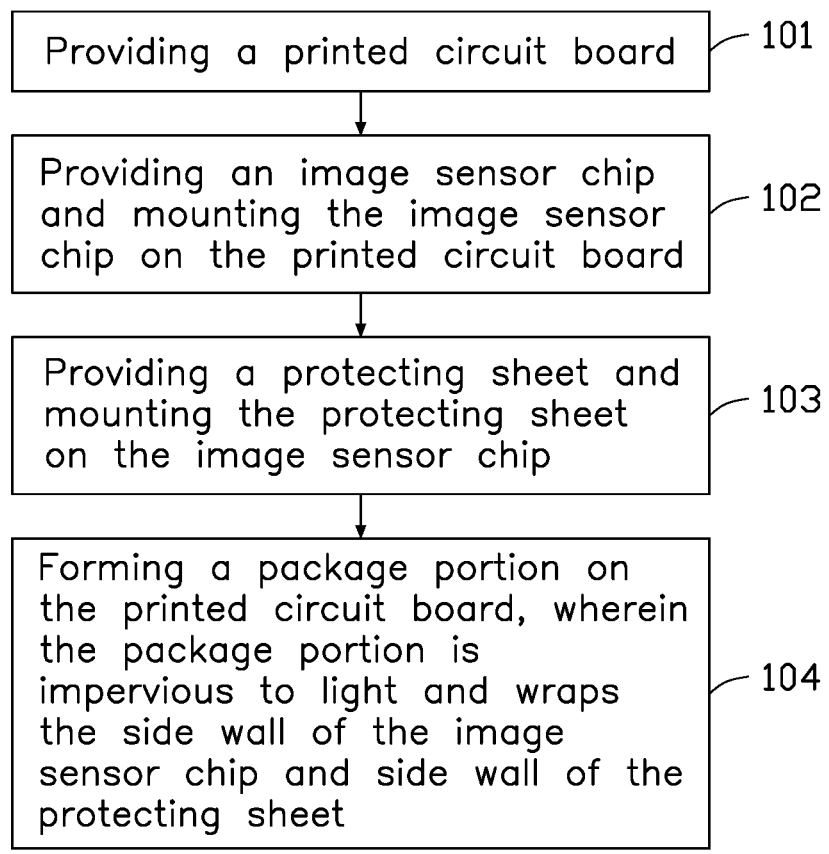
FIG. 1 is a flowchart of a method for manufacturing the chip encapsulation structure in FIG. 9.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 10:
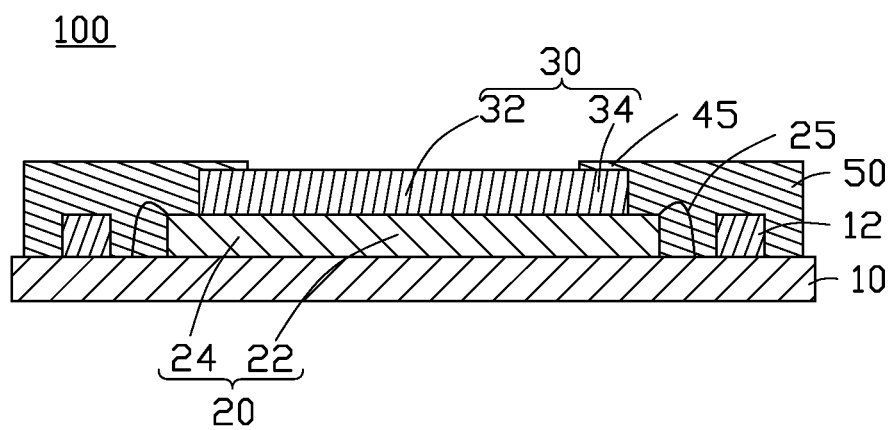
FIG. 10 is a cross-sectional view of the removable glue layer in FIG. 8 removed.
Figure 11:
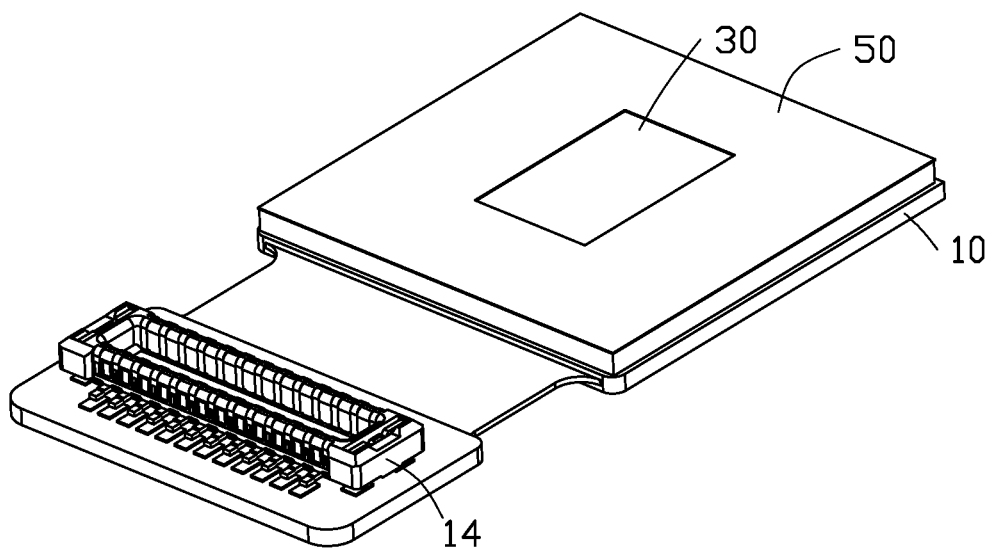
FIG. 11 is an isometric view of the chip encapsulation structure in FIG. 10 in accordance with one embodiment.

FIGS. 10-11 illustrate a chip encapsulation structure 100 used in an camera device, according to one embodiment. The chip encapsulation structure 100 includes a printed circuit board 10, an image sensor chip 20, a protecting sheet 30, and a package portion 50.

The printed circuit board 10 can be a flexible circuit board or a rigid-flexible board. In the illustrated embodiment, the printed circuit board 10 is a ceramic board.

The printed circuit board 10 is provided with circuit components 12 and a connector 14. In this embodiment, the circuit components 12 are mounted on an edge area of the printed circuit board 10. The circuit components 12 are electrically connected to the image sensor chip 20. The circuit components 12 may be, but are not limited to, resistors, capacitors, diodes, transistors, potentiometers, relays, and drivers, etc. The connector 14 is electrically connected to the image sensor chip 20 for signal transmission between the image sensor chip 20 and an electronic device.

The image sensor chip 20 is mounted on a central area of the printed circuit board 10 and electrically connected to the printed circuit board 10 via the wires 25. The image sensor chip 20 includes a photosensitive area 22 surrounded by a non-photosensitive area 24. The image sensor chip 20 and the printed circuit board 10 are electrically connected by wires 25.

The protecting sheet 30 is fixed on the image sensor chip 20. A size of the protecting sheet 30 is littler less than a size of the image sensor chip 20. In the embodiment, the protecting sheet 30 acts as an infrared cut-off filter to filter out infrared light. The protecting sheet 30 may also act as a color filter. The protecting sheet 30 is configured to protect the image sensor chip 20, and avoid dust and fragments from falling on the image sensor chip 20.

The protecting sheet 30 defines a light transmission area 32 and a peripheral area 34 surrounding the light transmission area 32 along an optical path of a lens module. The light transmission area 32 corresponds to the photosensitive area position 22.

The package portion 50 is completely opaque. The package portion 50 is mounted on the printed circuit board 10 and wraps the side wall of the image sensor chip 20, side wall of the supporting frame 30, and the peripheral area 34 of the protecting sheet 30. The package portion 50 also wraps the circuit components 12 and the wires 25. A material of the package portion 50 is plastic or resin, and color of the package portion 50 is black or other dark color. The package portion 50 located on the peripheral area 34 forms a light shielding layer 45. A thickness of the light shielding layer 45 is in a range from 0.1 millimeters to 0.3 millimeters.

When a lens module 60 is assembled on the chip encapsulation structure 100 a camera device 110 is formed, the light shielding layer 45 absorbs stray light and prevents ghosting.

FIG. 1 illustrates a method for manufacturing an image sensor chip encapsulation structure according to one embodiment. The method 1 is provided by way of embodiments as there are a variety of ways to carry out the method. The method 1 can begin at block 101.

Figure 2:
FIG. 2 is a cross-sectional view of a printed circuit board.
Figure 5:
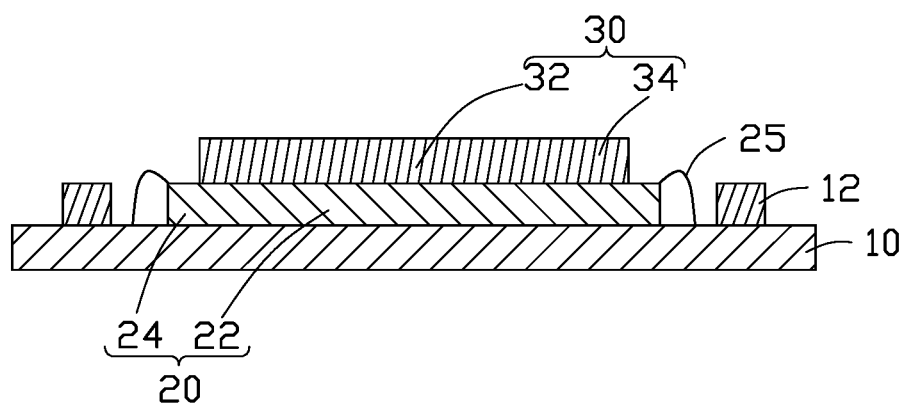
FIG. 5 is a cross-sectional view of a protecting sheet formed on the image sensor chip.
Figure 6:
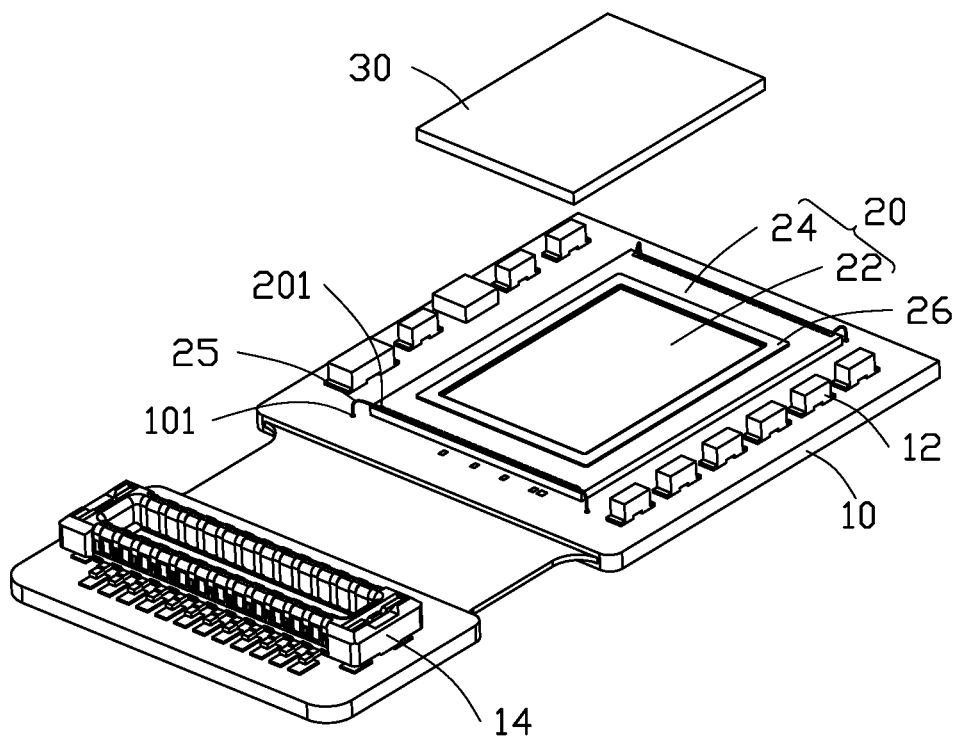
FIG. 6 is an exploded view of the protecting sheet in FIG. 5 and the printed circuit board in FIG. 2.

At block 101, as shown in FIG. 2, a printed circuit board 10 is provided. The printed circuit board 10 is provided with circuit members 12 and an electric connector 14, as shown in FIGS. 5-6. The printed circuit board 10 can be selected from, but is not limited to, a flexible circuit board, rigid-flexible board, or ceramic substrates, etc. In this embodiment, the circuit components 12 are mounted at an edge area of the printed circuit board 10. The circuit components 12 are electrically connected to the image sensor chip 20. The circuit components 12 may be, but are not limited to, resistors, capacitors, diodes, transistors, potentiometers, relays, and drivers. The electric connector 14 is electrically connected to the image sensor chip 20 to transmit signals between the image sensor chip 20 and an electronic device.

Figure 3:
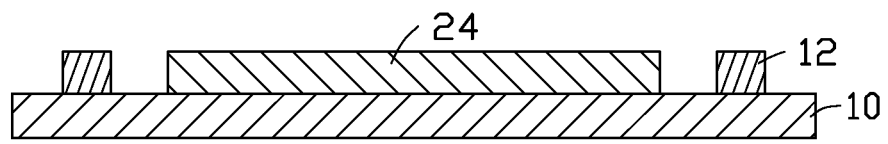
FIG. 3 is a cross-sectional view of an image sensor chip on the printed circuit board in FIG. 2.
Figure 4:
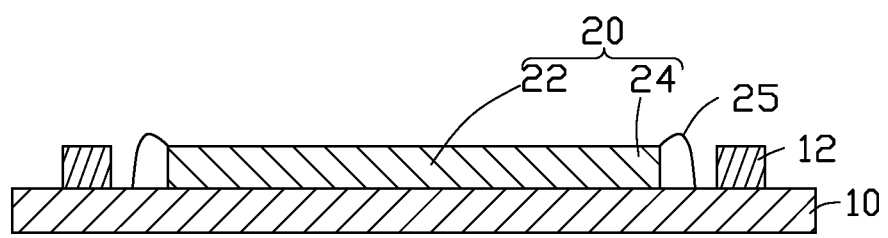
FIG. 4 is a cross-sectional view of the image sensor chip and the printed circuit board in FIG. 3 when electrically connected.

At block 102, as shown in FIGS. 3-4, an image sensor chip 20 is provided, and the image sensor chip 20 is mounted on the printed circuit board 10 and electrically connected to the printed circuit board 10. The image sensor chip 20 includes a photosensitive area 22 and a surrounding non-photosensitive area 24.

In the embodiment, the image sensor chip 20 is mounted on a central area of the printed circuit board 10 via a flip-chip method. As shown in FIG. 6, conductive pads 101, 201 are provided on the printed circuit board 10 and the image sensor chip 20. Wires 25 are applied to electrically connect the image sensor chip 20 and the printed circuit board 10, as shown in FIG. 4. The wires 25 connect to the conductive pads 101, 201 provided on the printed circuit board 10 and the image sensor chip 20. Material of wires 25 may be selected from, but is not limited to, gold, copper, aluminum, silver, etc. In particular, the wires 25 are arced or bent, thereby avoiding bending damage.

Figure 7:
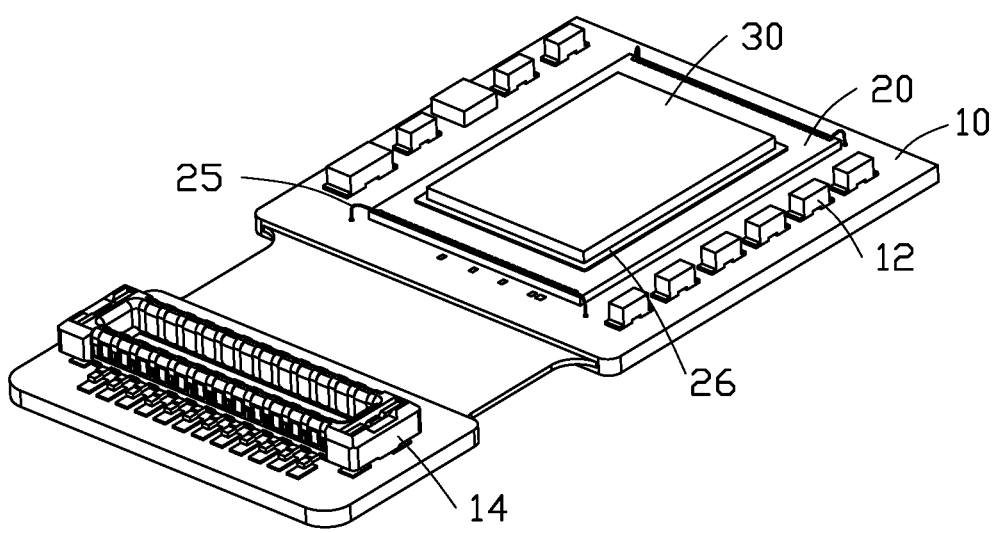
FIG. 7 is an isometric view of the protecting sheet and the printed circuit board formed together.

At block 103, as shown in FIGS. 5-7, a protecting sheet 30 is fixed on the image sensor chip 20 via a glue 26. The glue 26 is formed on the image sensor chip 20 and surrounds the non-photosensitive area 24 and exposes the photosensitive area 22. A size of the protecting sheet 30 is littler less than a size of the image sensor chip 20. In the shown embodiment, the protecting sheet 30 is an infrared cut-off filter to filter out infrared light. The protecting sheet 30 is also may be a color filter. The protecting sheet 30 is configured to protect the image sensor chip 20.

The protecting sheet 30 defines a light transmission area 32 and a peripheral area 34 surrounding the light transmission area 32 along an optical path of a lens module. The light transmission area 32 corresponds to the photosensitive area position 22.

Figure 8:
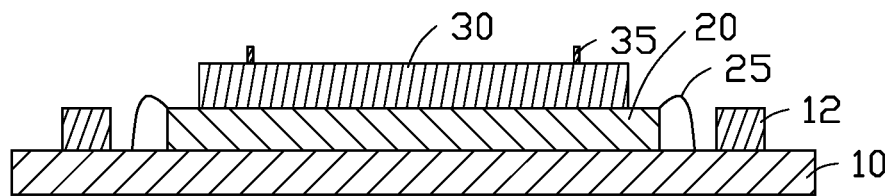
FIG. 8 is a cross-sectional view of a removable glue layer formed on the protecting sheet in FIG. 5.

At block 104, as shown in FIG. 8, a removable glue layer 35 is applied to form a retaining wall on a peripheral area 34 of the protecting sheet 30. The removable glue layer 35 protects the light transmission area 32 when forming the package portion 50 in the next block, to prevent molding material or excess material from entering the light transmission area 32 during molding.

Figure 9:
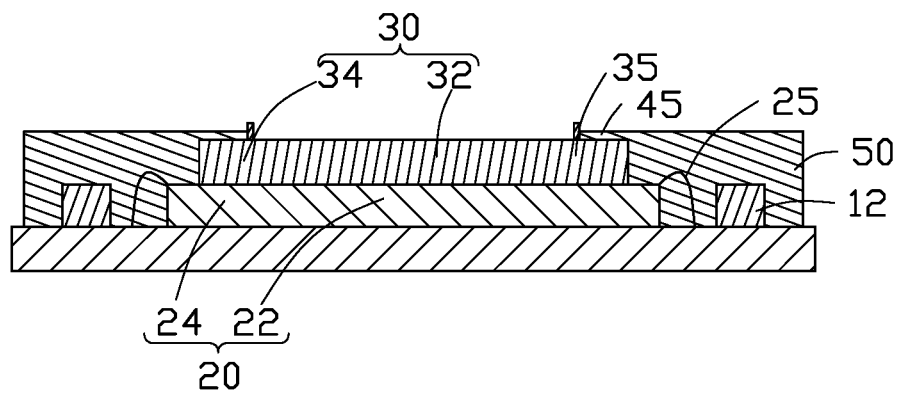
FIG. 9 is a cross-sectional view of a chip encapsulation structure formed on the printed circuit board.

At block 105, as shown in FIG. 9, the package portion 50 is formed on the printed circuit board 10. The package portion 50 also packages the circuit components 12 and the wires 25 in its interior so that the circuit components 12 are not directly exposed to air. The package portion 50 has complete opacity. The package portion 50 wraps the side wall of the protecting sheet 30, side wall of the protecting sheet 30, and the peripheral area 34 of the protecting sheet 30. A color of the package portion 50 is black or other dark color. The package portion 50 on the peripheral area 34 forms a light shielding layer 45.

The molding material is applied on the peripheral area 34 of the protecting sheet 30 by a flow process, thus thickness of the light shielding layer 45 is controllable. In the embodiment, a thickness of the light shielding layer 45 is in a range from 0.1 millimeters to 0.3 millimeters. The light shielding layer 45 absorbs stray light.

The light shielding layer 45 is formed by a process of molding on chip (MOC). There is thus no need to apply a light-absorbing black paint on the peripheral area 34 of the protecting sheet 30. Production cost of the protecting sheet 30 is reduced. The package portion 50 may be formed by, but is not limited to, an injection molding process or a molding process. The package portion 50 can be selected from but is not limited to nylon, LCP (liquid crystal polymer), PP (Polypropylene, polypropylene), or resin.

At block 106, as shown in FIGS. 9-10, the removable glue layer 35 is removed to achieve the chip encapsulation structure 100.

Figure 12:
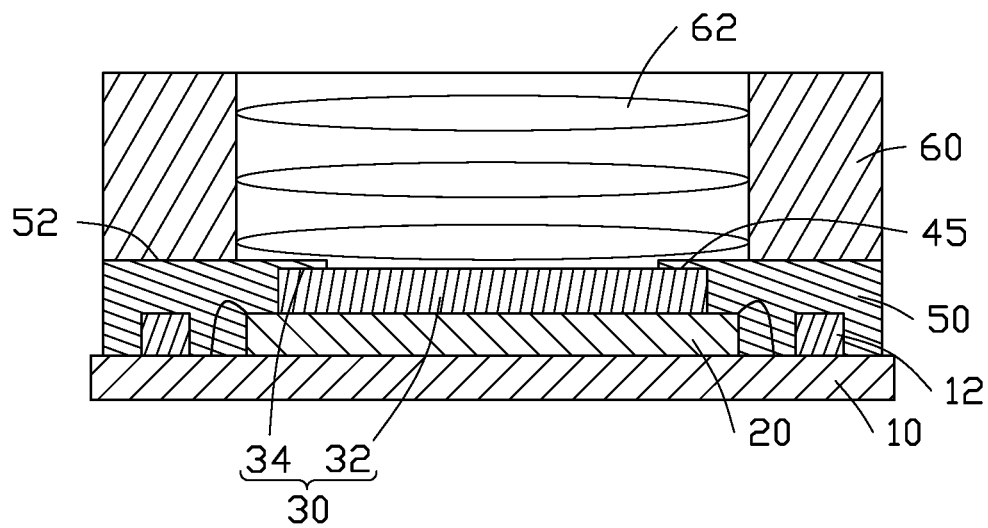
FIG. 12 is a cross-sectional view of the chip encapsulation structure formed as a camera device.

The packaging portion 50 includes a supporting surface 52 away from the printed circuit board 10, as shown in FIG. 12, and the supporting surface 52 is flat. The chip encapsulation structure 100 forms a camera device 110 when lens module 60 is fixed on the supporting surface 52 of the package portion 50. The optical lens 60 includes at least one lens 62. The necessarily close proximity between the at least one lens 62 and the protecting sheet 30 can lead to optical interference, or the at least one lens 62 being physically ruptured. In the embodiment, the light shielding layer 45 increases the distance between the at least one lens 62 and the protecting sheet 30, thus risk of interference between the at least one lens 62 and the protecting sheet 30 is reduced.

Figure 13:
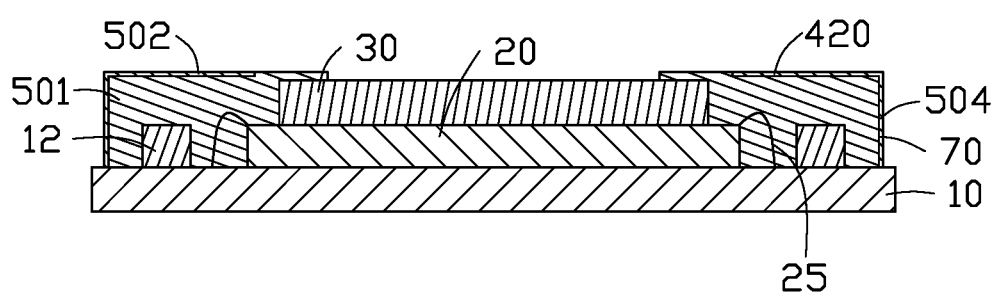
FIG. 13 is an isometric view of a chip encapsulation structure in accordance with one embodiment.

FIG. 13 shows a chip encapsulation structure 200 according to another embodiment. The chip encapsulation structure in FIG. 13 is similar to chip encapsulation structure 100 in FIG. 10. The difference between the chip encapsulation structure 200 and the chip encapsulation structure 100 in FIG. 10 is that the package portion 501 includes a supporting surface 502 away from the printed circuit board 10 and a side surface 504 perpendicular to the supporting surface 502. The package portion 501 further includes a metal sheet 70. The metal sheet 70 is insert molded on the supporting surface 502 and the side surface 504, the metal sheet 70 increases structural strength of the packaging portion 501.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a chip encapsulation structure comprising:

providing a printed circuit board;

providing an image sensor chip and mounting the image sensor chip on the printed circuit board;

providing a protecting sheet and mounting the protecting sheet on the image sensor chip;

providing a removable glue layer on a peripheral area of the protecting sheet;

forming a package portion on the printed circuit board, wherein the package portion is impervious to light and wraps a side wall of the image sensor chip and a side wall of the protecting sheet, wherein the package portion comprises a supporting surface away from the printed circuit board and a side surface perpendicular to the supporting surface;

removing the removable glue layer from the protecting sheet after forming the package portion on the printed circuit board; and insert-molding a metal sheet on portion of the supporting surface adjacent to the side surface.

2. The method of claim 1, wherein:

the image sensor chip comprises a photosensitive area and a non-photosensitive area surrounding the photosensitive area, and the protecting sheet is fixed on the non-photosensitive area via glue.

3. The method of claim 2, wherein:

the package portion further covers a portion surface of the protecting sheet away from the image sensor chip, and the package portion on the portion surface of the protecting sheet forms a light shielding layer.

4. The method of claim 3, wherein:

a thickness of the light shielding layer is in a range from 0.1 millimeters to 0.3 millimeters.

\* \* \* \* \*